(12) United States Patent
Castleman

(10) Patent No.: US 12,126,888 B2
(45) Date of Patent: Oct. 22, 2024

(54) NEAR INFRARED (NIR) TRANSPARENT ORGANIC LIGHT EMITTING DIODE (OLED) DISPLAY

(71) Applicant: Sony Interactive Entertainment Inc., Tokyo (JP)

(72) Inventor: Dennis Castleman, San Mateo, CA (US)

(73) Assignee: Sony Interactive Entertainment Inc., Tokyo (JP)

(*) Notice: Subject to any disclaimer, the term of this patent is extended or adjusted under 35 U.S.C. 154(b) by 127 days.

(21) Appl. No.: 17/749,523

(22) Filed: May 20, 2022

(65) Prior Publication Data

US 2023/0412907 A1  Dec. 21, 2023

(51) Int. Cl.
| | | |
|---|---|---|
| G06F 3/00 | (2006.01) | |
| G06F 3/01 | (2006.01) | |
| G09G 3/3208 | (2016.01) | |
| H04N 5/06 | (2006.01) | |
| H04N 23/56 | (2023.01) | |
| H04N 23/57 | (2023.01) | |

(52) U.S. Cl.
CPC ............ *H04N 23/57* (2023.01); *G06F 3/013* (2013.01); *G09G 3/3208* (2013.01); *H04N 5/06* (2013.01); *H04N 23/56* (2023.01); *G09G 2310/08* (2013.01); *G09G 2354/00* (2013.01)

(58) Field of Classification Search
CPC .......... H04N 23/57; H04N 5/06; H04N 23/56; H04N 23/20; G06F 3/013; G09G 3/3208; G09G 2310/08; G09G 2354/00; G02B 27/0093; G02B 27/0172; H10K 50/10
See application file for complete search history.

(56) References Cited

U.S. PATENT DOCUMENTS

| | | | | |
|---|---|---|---|---|
| 5,126,081 | A * | 6/1992 | Willingham | C01G 9/08 264/1.21 |
| 10,347,179 | B2 * | 7/2019 | Kim | G09G 3/3266 |
| 10,429,927 | B1 * | 10/2019 | Sharma | G06F 3/0346 |
| 2010/0046059 | A1 * | 2/2010 | McCabe | G02B 5/0858 359/263 |
| 2013/0106787 | A1 * | 5/2013 | Lee | G06F 3/042 345/175 |
| 2015/0181099 | A1 * | 6/2015 | Van Der Tempel | G01S 7/4911 348/135 |
| 2017/0094271 | A1 * | 3/2017 | Liu | H04N 19/176 |
| 2017/0220844 | A1 * | 8/2017 | Jones | G06F 1/1637 |
| 2018/0048909 | A1 * | 2/2018 | Liu | H04N 19/105 |
| 2018/0081093 | A1 * | 3/2018 | Wang | G02B 5/0231 |
| 2018/0103260 | A1 * | 4/2018 | Chuang | H04N 19/70 |
| 2018/0124394 | A1 * | 5/2018 | Xu | H04N 19/573 |
| 2018/0152727 | A1 * | 5/2018 | Chuang | H04N 19/70 |

(Continued)

OTHER PUBLICATIONS

"International Search Report and Written Opinion", dated Jan. 4, 2024, from the counterpart PCT application PCT/US23/66110.

*Primary Examiner* — Frank F Huang
(74) *Attorney, Agent, or Firm* — John L. Rogitz; John M. Rogitz

(57) ABSTRACT

A micro-OLED display includes a substrate with a coating made of IR-transparent material such as Zinc Selenide or Zinc Sulfide to allow a pupil tracking camera, which may include photodiodes, to be mounted directly behind the display. The coating is transparent to near infrared (NIR) radiation but opaque to visible light.

16 Claims, 5 Drawing Sheets

(56) References Cited

U.S. PATENT DOCUMENTS

2019/0065845 A1\* 2/2019 Xu .................. G06F 21/602
2020/0344398 A1\* 10/2020 Fruchtman ............. H04N 25/57
2020/0401220 A1\* 12/2020 Jain .................... G02B 27/0093
2021/0075978 A1\* 3/2021 Sowa ..................... H04N 23/84

\* cited by examiner

NEAR INFRARED (NIR) TRANSPARENT ORGANIC LIGHT EMITTING DIODE (OLED) DISPLAY

FIELD

The present application relates generally to near infrared transparent organic light emitting diode (OLED) displays such as head-mounted displays for extended reality (XR) applications such as computer games.

BACKGROUND

As recognized herein, organic light emitting diode (OLED) displays may be used in head-mounted displays (HMD) or headsets to facilitate eye tracking of the wearer for purposes of, e.g., presenting augmented reality and/or virtual reality images on the display. As understood herein, eye tracking of the wearer is necessary for many XR applications and furthermore camera placement for eye tracking optimally is directly in front of the pupil. However, present principles further understand that eye tracking cameras are not located optimally. This is because, if located between the substrate of the display and the eye, a camera directly in front of the pupil blocks the display, and if located on the outside of the display, the opaque coating on the display substrate for allowing the display to appear black when a pixel is not active blocks images of the pupil from reaching the camera.

SUMMARY

A micro-OLED display includes a substrate with a coating made of IR-transparent material such as Zinc Selenide or Zinc Sulfide to allow a pupil tracking camera, which may include photodiodes, to be mounted directly behind the display, i.e., with the display between the pupil and the camera. The coating is transparent to near infrared (NIR) radiation but opaque to visible light.

Accordingly, in one aspect an assembly includes at least one organic light emitting diode (OLED) display with an innermost surface and at least one substrate. A coating is on the substrate. The coating has infrared (IR)-transparent material that is transparent to at least near infrared (NIR) radiation but opaque to visible light. At least one camera is configured to generate images from IR light. The camera is disposed to receive light through the coating.

The coating may include Zinc Selenide and/or Zinc Sulfide.

In some examples the OLED display includes a micro-OLED display.

In example embodiments at least one IR illumination lamp is configured to emit IR toward an eye of a wearer of the apparatus.

In example implementations the assembly includes at least one processor configured with instructions to activate the camera or the lamp or both the camera and the lamp starting at a beginning of a null period between first and second periods of rendering respective first and second frames of a demanded image. The instructions may be executable to deenergize the camera or the lamp or both the camera and the lamp at the end of the null period. Or, the instructions may be executable to deenergize the camera or the lamp or both the camera and the lamp at a time during the second period of rendering the second frame of the demanded image.

In an example, the camera is disposed on an outer surface of the substrate. In another example, the camera is connected to an arm and is oriented to image an outer surface of the substrate. In some examples, the camera is an IR image sensor. In a non-limiting implementation, the IR image sensor is bonded directly to the back (outer surface) of the substrate, opposite the innermost surface, and the substrate is used as a lens.

In another aspect, a method includes presenting frames of demanded images on at least one head-mounted display (HMD). The method also includes, at least during a null period between first and second frames, generating at least one image of a pupil of a wearer of the HMD.

The method may include, during the null period, illuminating the pupil with infrared (IR) light. In examples, the method includes generating the image of the pupil using the IR light after the IR light passes through a layer of material that blocks visible light. The image can be used for eye tracking of the wearer.

The method can include energizing the camera only during the null period plus part but not all of a period of scanning the second frame. Or, the method can include energizing the camera only during the null period.

In another aspect, a head-mounted display (HMD) for generating demanded images of at least one computer simulation based at least in part on tracking at least one pupil of a wearer of the HMD includes at least one organic light-emitting diode (OLED) display. The HMD also includes at least one pupil tracking camera configured to generate images from infrared (IR) light. At least one substance is configured to pass IR light from the pupil to the camera for generation of the images by the camera and to block, from the camera, visible light from the OLED display such that at least one computer simulation engine configured to generate the demanded images can do so based at least in part on images from the camera.

The details of the present application, both as to its structure and operation, can be best understood in reference to the accompanying drawings, in which like reference numerals refer to like parts, and in which:

DETAILED DESCRIPTION

Figure 1:
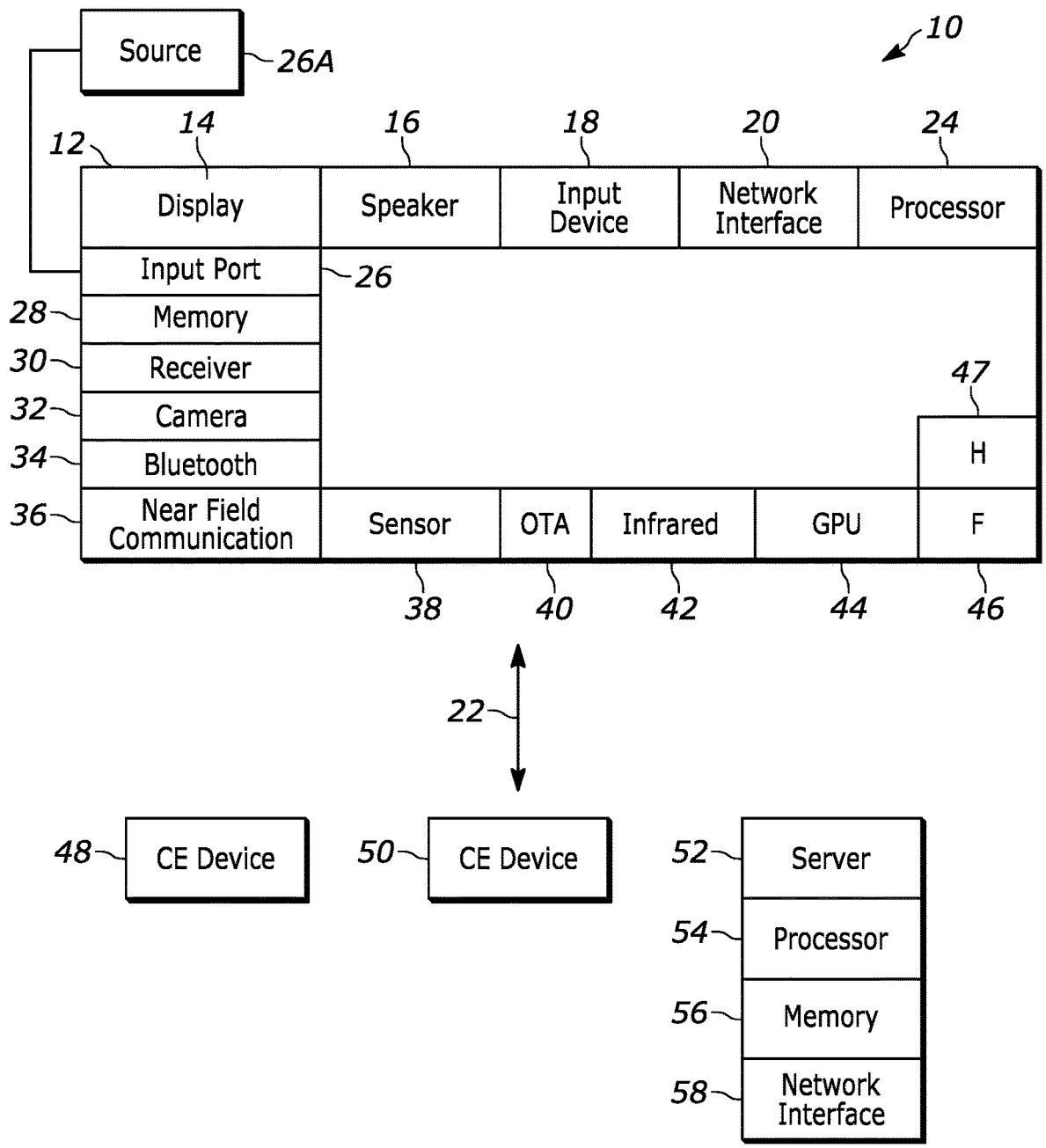
FIG. 1 is a block diagram of an example system in accordance with present principles.

This disclosure relates generally to computer ecosystems including aspects of consumer electronics (CE) device networks such as but not limited to computer game networks. A system herein may include server and client components which may be connected over a network such that data may be exchanged between the client and server components. The client components may include one or more computing devices including game consoles such as Sony PlayStation® or a game console made by Microsoft or Nintendo or other manufacturer, extended reality (XR) headsets such as virtual reality (VR) headsets, augmented reality (AR) headsets, portable televisions (e.g., smart TVs, Internet-enabled TVs), portable computers such as laptops and tablet computers, and other mobile devices including smart phones and additional examples discussed below. These client devices may operate with a variety of operating environments. For example, some of the client computers may employ, as examples, Linux operating systems, operating systems from Microsoft, or a Unix operating system, or operating systems produced by Apple, Inc., or Google, or a Berkeley Software Distribution or Berkeley Standard Distribution (BSD) OS including descendants of BSD. These operating environments may be used to execute one or more browsing programs, such as a browser made by Microsoft or Google or Mozilla or other browser program that can access websites hosted by the Internet servers discussed below. Also, an operating environment according to present principles may be used to execute one or more computer game programs.

Servers and/or gateways may be used that may include one or more processors executing instructions that configure the servers to receive and transmit data over a network such as the Internet. Or a client and server can be connected over a local intranet or a virtual private network. A server or controller may be instantiated by a game console such as a Sony PlayStation®, a personal computer, etc.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website or gamer network to network members.

A processor may be a single- or multi-chip processor that can execute logic by means of various lines such as address lines, data lines, and control lines and registers and shift registers.

Components included in one embodiment can be used in other embodiments in any appropriate combination. For example, any of the various components described herein and/or depicted in the Figures may be combined, interchanged, or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together.

Referring now to FIG. 1, an example system 10 is shown, which may include one or more of the example devices mentioned above and described further below in accordance with present principles. The first of the example devices included in the system 10 is a consumer electronics (CE) device such as an audio video device (AVD) 12 such as but not limited to a theater display system which may be projector-based, or an Internet-enabled TV with a TV tuner (equivalently, set top box controlling a TV). The AVD 12 alternatively may also be a computerized Internet enabled ("smart") telephone, a tablet computer, a notebook computer, a head-mounted device (HMD) and/or headset such as smart glasses or a VR headset, another wearable computerized device, a computerized Internet-enabled music player, computerized Internet-enabled headphones, a computerized Internet-enabled implantable device such as an implantable skin device, etc. Regardless, it is to be understood that the AVD 12 is configured to undertake present principles (e.g., communicate with other CE devices to undertake present principles, execute the logic described herein, and perform any other functions and/or operations described herein).

Accordingly, to undertake such principles the AVD 12 can be established by some, or all of the components shown. For example, the AVD 12 can include one or more touch-enabled displays 14 that may be implemented by a high definition or ultra-high definition "4K" or higher flat screen. The touch-enabled display(s) 14 may include, for example, a capacitive or resistive touch sensing layer with a grid of electrodes for touch sensing consistent with present principles.

The AVD 12 may also include one or more speakers 16 for outputting audio in accordance with present principles, and at least one additional input device 18 such as an audio receiver/microphone for entering audible commands to the AVD 12 to control the AVD 12. The example AVD 12 may also include one or more network interfaces 20 for communication over at least one network 22 such as the Internet, an WAN, an LAN, etc. under control of one or more processors 24. Thus, the interface 20 may be, without limitation, a Wi-Fi transceiver, which is an example of a wireless computer network interface, such as but not limited to a mesh network transceiver. It is to be understood that the processor 24 controls the AVD 12 to undertake present principles, including the other elements of the AVD 12 described herein such as controlling the display 14 to present images thereon and receiving input therefrom. Furthermore, note the network interface 20 may be a wired or wireless modem or router, or other appropriate interface such as a wireless telephony transceiver, or Wi-Fi transceiver as mentioned above, etc.

In addition to the foregoing, the AVD 12 may also include one or more input and/or output ports 26 such as a high-definition multimedia interface (HDMI) port or a universal serial bus (USB) port to physically connect to another CE device and/or a headphone port to connect headphones to the AVD 12 for presentation of audio from the AVD 12 to a user through the headphones. For example, the input port 26 may be connected via wire or wirelessly to a cable or satellite source 26a of audio video content. Thus, the source 26a may be a separate or integrated set top box, or a satellite receiver. Or the source 26a may be a game console or disk player containing content. The source 26a when implemented as a game console may include some or all of the components described below in relation to the CE device 48.

The AVD 12 may further include one or more computer memories/computer-readable storage media 28 such as disk-based or solid-state storage that are not transitory signals, in some cases embodied in the chassis of the AVD as stand-alone devices or as a personal video recording device (PVR) or video disk player either internal or external to the chassis of the AVD for playing back AV programs or as removable memory media or the below-described server. Also, in some embodiments, the AVD 12 can include a position or location receiver such as but not limited to a cellphone receiver, GPS receiver and/or altimeter 30 that is configured to receive geographic position information from a satellite or cellphone base station and provide the information to the processor 24 and/or determine an altitude at which the AVD 12 is disposed in conjunction with the processor 24. The component 30 may also be implemented by an inertial measurement unit (IMU) that typically includes a combination of accelerometers, gyroscopes, and magnetometers to determine the location and orientation of the AVD 12 in three dimension or by an event-based sensors such as event detection sensors (EDS). An EDS consistent with the present disclosure provides an output that indicates a change in light intensity sensed by at least one pixel of a light sensing array. For example, if the light sensed by a pixel is decreasing, the output of the EDS may be −1; if it is increasing, the output of the EDS may be a +1. No change in light intensity below a certain threshold may be indicated by an output binary signal of 0.

Continuing the description of the AVD 12, in some embodiments the AVD 12 may include one or more cameras 32 that may be a thermal imaging camera, a digital camera such as a webcam, an IR sensor, an event-based sensor, and/or a camera integrated into the AVD 12 and controllable by the processor 24 to gather pictures/images and/or video in accordance with present principles. Also included on the AVD 12 may be a Bluetooth transceiver 34 and other Near Field Communication (NFC) element 36 for communication with other devices using Bluetooth and/or NFC technology, respectively. An example NFC element can be a radio frequency identification (RFID) element.

Further still, the AVD 12 may include one or more auxiliary sensors 38 (e.g., a pressure sensor, a motion sensor such as an accelerometer, gyroscope, cyclometer, or a magnetic sensor, an infrared (IR) sensor, an optical sensor, a speed and/or cadence sensor, an event-based sensor, a gesture sensor (e.g., for sensing gesture command)) that provide input to the processor 24. For example, one or more of the auxiliary sensors 38 may include one or more pressure sensors forming a layer of the touch-enabled display 14 itself and may be, without limitation, piezoelectric pressure sensors, capacitive pressure sensors, piezoresistive strain gauges, optical pressure sensors, electromagnetic pressure sensors, etc.

The AVD 12 may also include an over-the-air TV broadcast port 40 for receiving OTA TV broadcasts providing input to the processor 24. In addition to the foregoing, it is noted that the AVD 12 may also include an infrared (IR) transmitter and/or IR receiver and/or IR transceiver 42 such as an IR data association (IRDA) device. A battery (not shown) may be provided for powering the AVD 12, as may be a kinetic energy harvester that may turn kinetic energy into power to charge the battery and/or power the AVD 12. A graphics processing unit (GPU) 44 and field programmable gated array 46 also may be included. One or more haptics/vibration generators 47 may be provided for generating tactile signals that can be sensed by a person holding or in contact with the device. The haptics generators 47 may thus vibrate all or part of the AVD 12 using an electric motor connected to an off-center and/or off-balanced weight via the motor's rotatable shaft so that the shaft may rotate under control of the motor (which in turn may be controlled by a processor such as the processor 24) to create vibration of various frequencies and/or amplitudes as well as force simulations in various directions.

A light source such as a projector such as an infrared (IR) projector also may be included.

In addition to the AVD 12, the system 10 may include one or more other CE device types. In one example, a first CE device 48 may be a computer game console that can be used to send computer game audio and video to the AVD 12 via commands sent directly to the AVD 12 and/or through the below-described server while a second CE device 50 may include similar components as the first CE device 48. In the example shown, the second CE device 50 may be configured as a computer game controller manipulated by a player or a head-mounted display (HMD) worn by a player. The HMD may include a heads-up transparent or non-transparent display for respectively presenting AR/MR content or VR content (more generally, extended reality (XR) content). The HMD may be configured as a glasses-type display or as a bulkier VR-type display vended by computer game equipment manufacturers.

In the example shown, only two CE devices are shown, it being understood that fewer or greater devices may be used. A device herein may implement some or all of the components shown for the AVD 12. Any of the components shown in the following figures may incorporate some or all of the components shown in the case of the AVD 12.

Now in reference to the afore-mentioned at least one server 52, it includes at least one server processor 54, at least one tangible computer readable storage medium 56 such as disk-based or solid-state storage, and at least one network interface 58 that, under control of the server processor 54, allows for communication with the other illustrated devices over the network 22, and indeed may facilitate communication between servers and client devices in accordance with present principles. Note that the network interface 58 may be, e.g., a wired or wireless modem or router, Wi-Fi transceiver, or other appropriate interface such as, e.g., a wireless telephony transceiver.

Accordingly, in some embodiments the server 52 may be an Internet server or an entire server "farm" and may include and perform "cloud" functions such that the devices of the system 10 may access a "cloud" environment via the server 52 in example embodiments for, e.g., network gaming applications. Or the server 52 may be implemented by one or more game consoles or other computers in the same room as the other devices shown or nearby.

The components shown in the following figures may include some or all components shown in herein. Any user interfaces (UI) described herein may be consolidated and/or expanded, and UI elements may be mixed and matched between UIs.

Present principles may employ various machine learning models, including deep learning models. Machine learning models consistent with present principles may use various algorithms trained in ways that include supervised learning, unsupervised learning, semi-supervised learning, reinforcement learning, feature learning, self-learning, and other forms of learning. Examples of such algorithms, which can be implemented by computer circuitry, include one or more neural networks, such as a convolutional neural network (CNN), a recurrent neural network (RNN), and a type of RNN known as a long short-term memory (LSTM) network. Support vector machines (SVM) and Bayesian networks also may be considered to be examples of machine learning models. In addition to the types of networks set forth above, models herein may be implemented by classifiers.

As understood herein, performing machine learning may therefore involve accessing and then training a model on training data to enable the model to process further data to make inferences. An artificial neural network/artificial intelligence model trained through machine learning may thus include an input layer, an output layer, and multiple hidden layers in between that that are configured and weighted to make inferences about an appropriate output.

Figure 2:
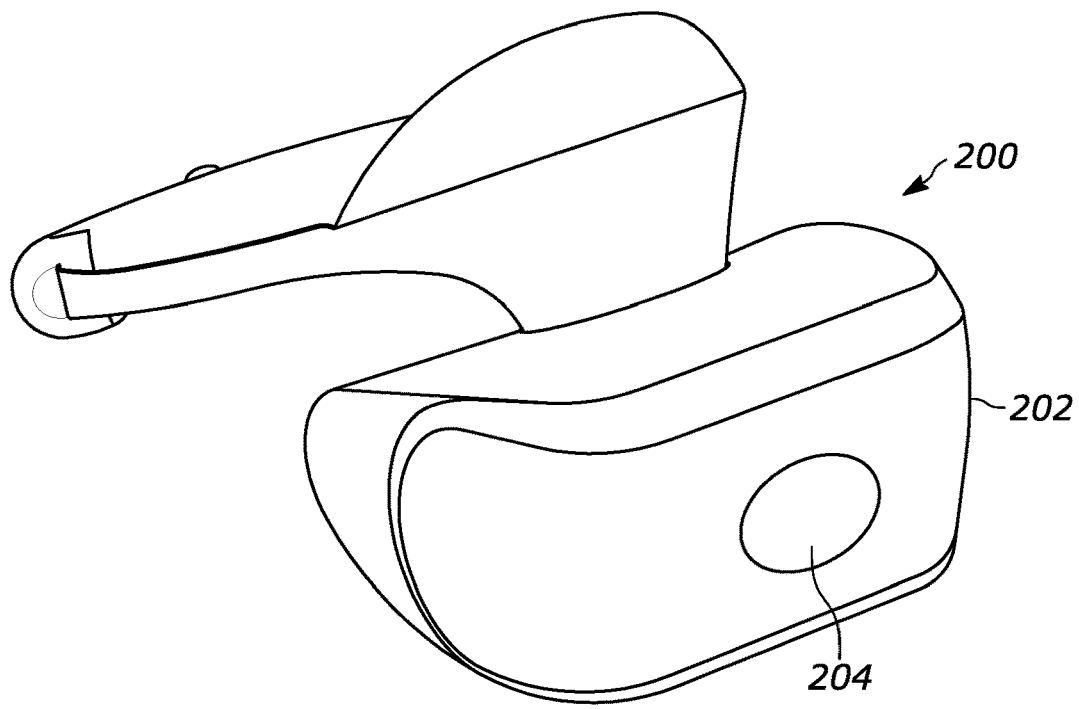
FIG. 2 illustrates a first embodiment of a head-mounted display (HMD) with tracking camera.

Referring now to FIG. 2, a HMD 200 that may incorporate any or all of the components shown for any of the devices in FIG. 1 may include an exterior display surface 202 on which is mounted at least one eye-tracking (also referred to herein as pupil-tracking) camera 204. Note that the size of the camera 204 shown in FIG. 2 may not be scale. The camera 204 may be adhesively bonded to the exterior display surface 202 or otherwise engaged with the surface 202 on the exterior side of the IR transmissive layer discussed further below, i.e., on the side of the IR transmissive layer opposite the eyes of the wearer of the HMD 200. The camera 204 is preferably located on the surface 202 along the nominal line of sight of a pupil of the wearer when the wearer is looking straight ahead.

Figure 3:
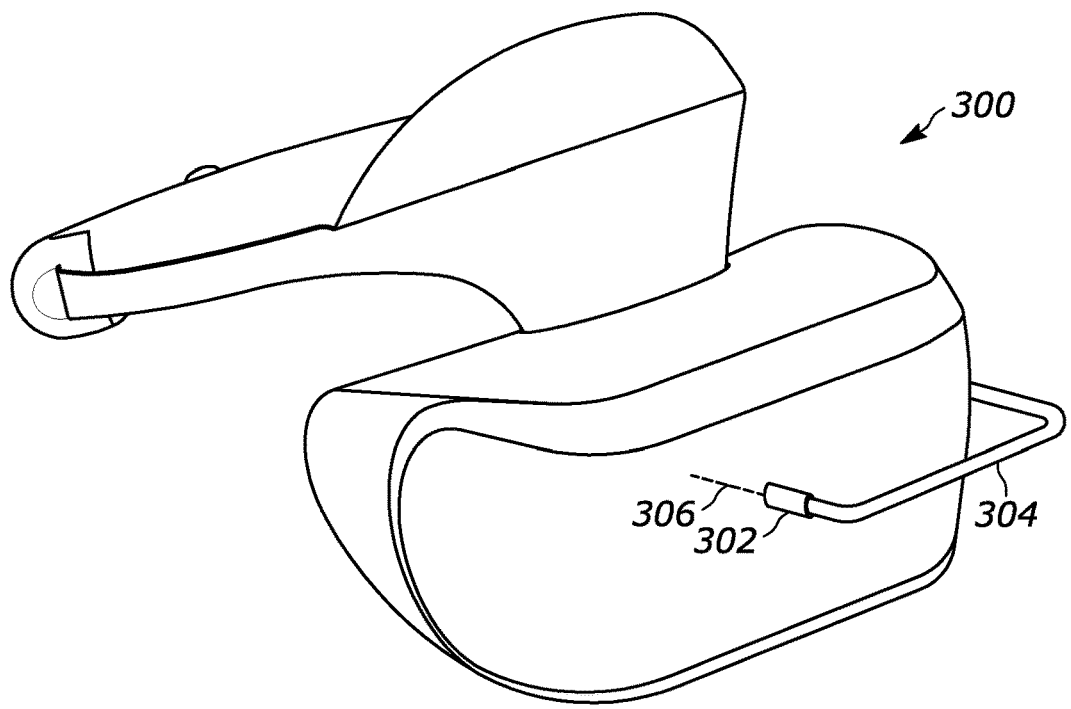
FIG. 3 illustrates a second embodiment of a HMD with tracking camera.

FIG. 3 illustrates an alternate HMD 300 in which a camera 302 is mounted by means of an arm 304 to the HMD to be positioned along the nominal line of sight 306 of a pupil of the wearer when the wearer is looking straight ahead. The arms 304 may be immovable or it may articulate to move the camera toward and away from the display.

Figure 4:
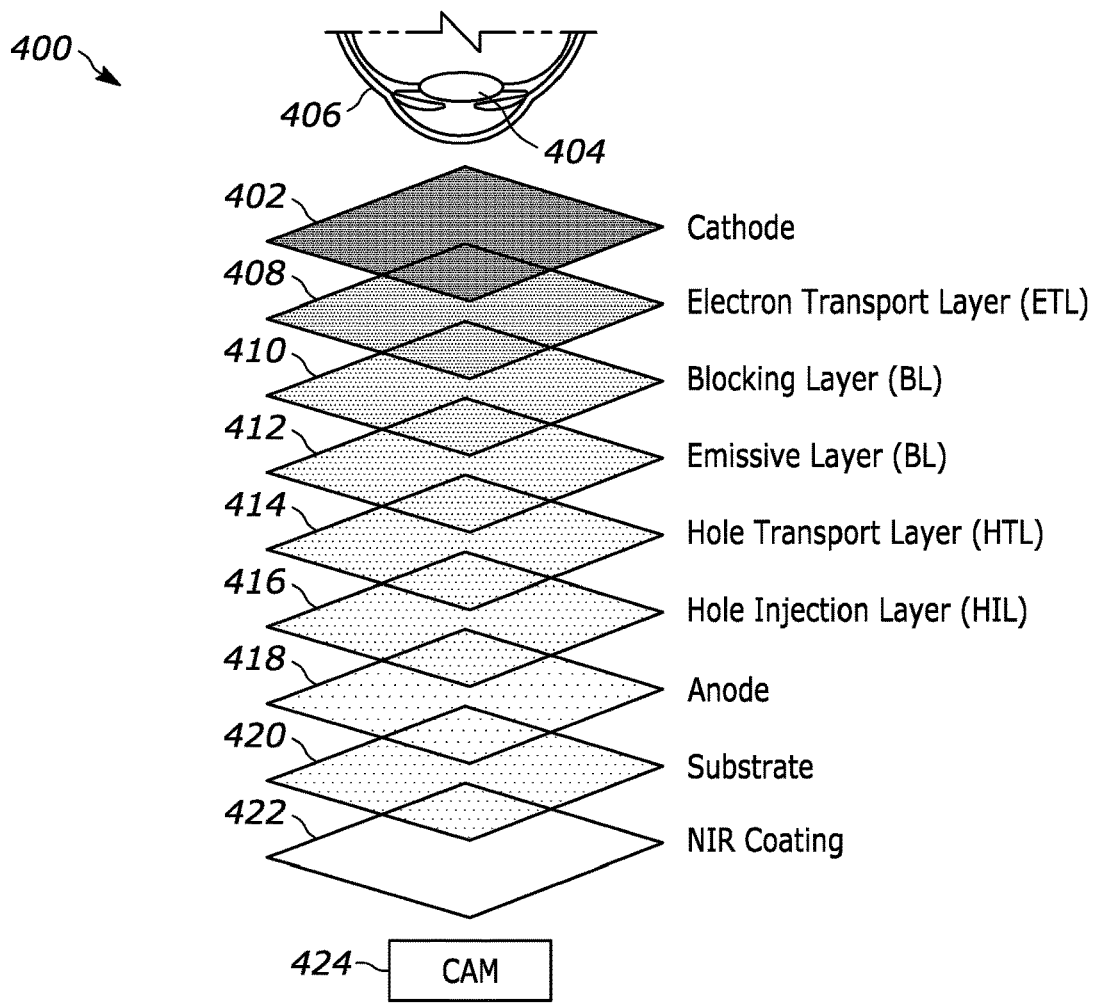
FIG. 4 illustrates an exploded view of various layers of an example HMD.

FIG. 4 illustrates layers of an example HMD 400 having an innermost layer 402 closest to the pupil 404 of the eye 406 of a wearer of the HMD 400 that establishes a cathode. Next to the innermost layer 402 is an electron transport layer 408, then a blocking layer 410, then an emissive layer 412 that may include organic light emitting diodes (OLED). Continuing from innermost layer to outer most, next to the emissive layer 412 may be a hole transport layer 414, then a hole injection layer 416, and an anode 418 on a substrate 420.

As shown in FIG. 4, on the outer surface of the substrate 420, an infrared coating such as a near infrared (NIR) coating 422 is deposited that allows IR light to propagate through the layer 422 but that blocks visible light from propagating through the layer 422. The coating 422 may include Zinc Selenide and/or Zinc Sulfide, for instance. In some embodiments the coating 422 may be applied to the inner layer of the substrate 420. A camera 424 such as any of the cameras described herein is juxtaposed with the outer surface of the substrate 420 as described above preferably along the line of sight of the pupil 404 when the wearer is looking straight ahead, to directly image IR light reflecting off the pupil. The camera 424 is thus a camera capable of producing images from IR light.

Figure 5:
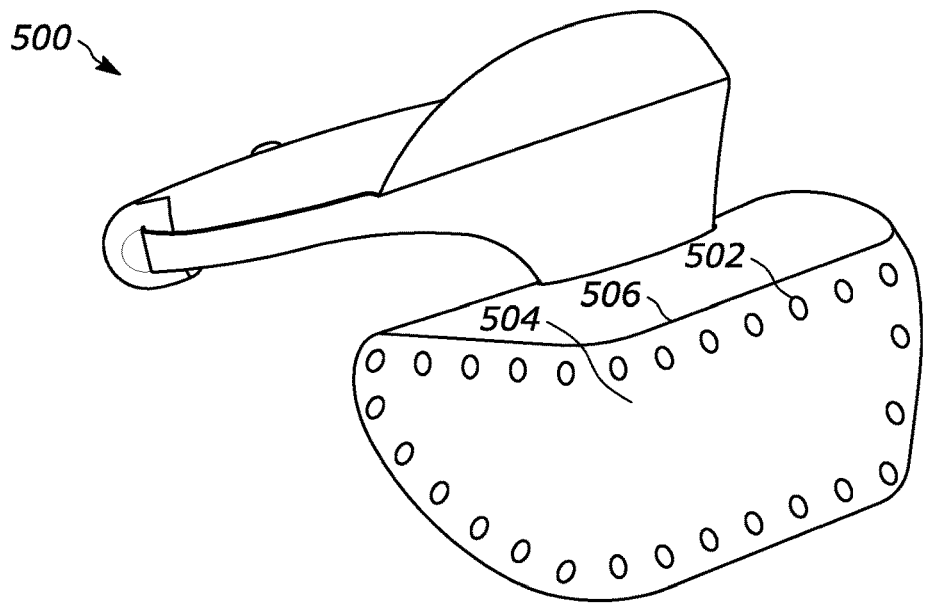
FIG. 5 illustrates IR light emitting diodes (LED) in an example configuration for illumination of the pupil.

FIG. 5 illustrates a display 500 such as any display disclosed herein including the HMDs shown in FIGS. 2-4 in which one or more (preferably plural) IR-emitting illumination lamps 502 are arranged on an inner surface 504 of the display 500 to illuminate the pupil of the eye of the wearer consistent with principles described herein. In the example shown, the illumination lamps 502 are equally spaced along the outer periphery 506 of the display 500, it being understood that other arrangement of the illumination lamps 502 may be implemented. The illumination lamps 502 may be added to the OLED emitters in the emissive layer 412 shown in FIG. 4 after the OLED is formed, or they may be established by peripheral OLED emitters that are native to the emissive layer 412 itself and thus that may perform two tasks, one in emitting light during active image formation to form part of the image presented on the display and the other to emit IR illumination light for purposes of pupil tracking consistent with principles discussed herein.

Figure 6:
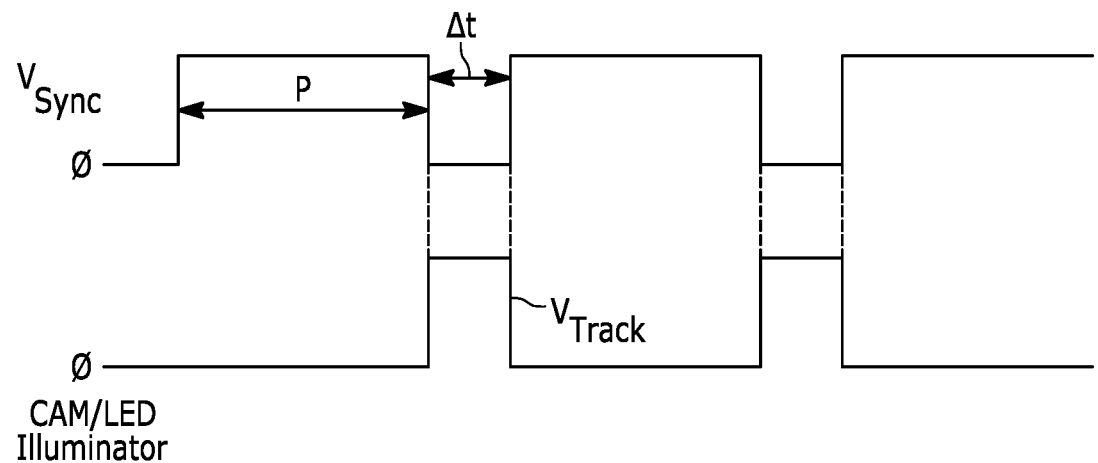
FIG. 6 illustrates a first example timing graph between active image presentation and pause intervals between frames versus tracking camera and/or illuminating LED activation.

Refer now to FIG. 6. An OLED display in a HMD typically scans horizontal lines from top to bottom during a period "P" to present a frame of a demanded image. During the period "P", a voltage referred to herein as a synchronizing voltage $V_{sync}$ is driven high from a low voltage, e.g., zero, to $V_{sync}$. The period "P" may be, e.g., between two and twelve milliseconds (2 ms-12 ms) in length and in one embodiment may be 8.5 ms, and frame refresh rates of 60 frames per second (fps), 120 fps, or 240 fps, as but three examples, may be used. During the frame rendering period "P" the pupil tracking camera is not energized.

On the other hand, in between frame rendering, $V_{sync}$ returns to a low for a null period $\Delta t$, during which period of no demanded image rendering, the pupil-tracking camera described herein is activated as indicated by the tracking activation voltage graph $V_{track}$ in FIG. 6. The length of the null period $\Delta t$ may be, e.g., from two to six milliseconds (2 ms-6 ms) in example implementations. Also, the IR illumination lamps such as the LEDs 502 shown in FIG. 5 are activated to emit IR light during the period $\Delta t$ so that as the camera is actively imaging the eye, the eye is being actively illuminated by IR radiation. By timing IR eye tracking to occur when no active frame rendering is being conducted, the camera detects IR only from the pupil of the eye and not IR that may be emitted as part of frame rendering. In the example shown in FIG. 6, the camera (and IR illuminators) are deenergized at the start of the next period "P" of frame rendering.

Figure 7:
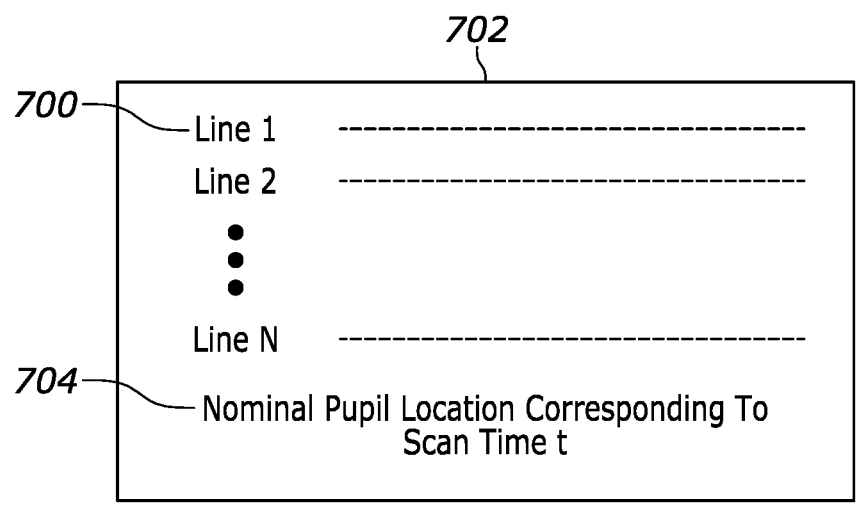
FIG. 7 schematically illustrates a portion of a frame during active image presentation.
Figure 8:
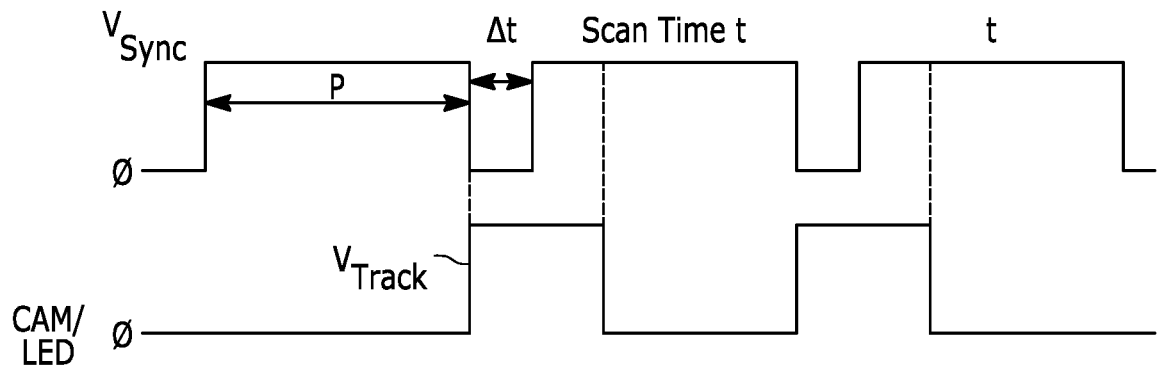
FIG. 8 illustrates a second example timing graph between active image presentation and pause intervals between frames versus tracking camera and/or illuminating LED activation consistent with FIG. 7.

FIGS. 7 and 8 illustrate a recognition that some pupil tracking may occur during active frame rendering under the following conditions. As shown by LED activation lines 700 on an OLED display 702 such as any display described herein, line 1 is first scanned, then below it line, until an $N^{th}$ line is scanned just above the nominal location 704 at which the pupil is relative to the display, at a time during the frame rendering period "P" referred to herein as "scan time t". Lines N+1 et seq. are subsequently scanned (after "scan time t") below the $N^{th}$ line to render a frame of a demanded image during the period "P" to present a frame of a demanded image.

FIG. 8 illustrates that present principles understand that the pupil may be tracked up during part of the period "P" to present a frame of a demanded image up to completion of the scan of the $N^{th}$ line shown in FIG. 7. More specifically, as was the case in the example of FIG. 6, in FIG. 8 during the period "P", the synchronizing voltage $V_{sync}$ is driven high from a low voltage, and in between frame rendering, $V_{sync}$ returns to a low for a period $\Delta t$. During the period $\Delta t$, the pupil-tracking camera described herein is activated as indicated by the tracking activation voltage graph $V_{track}$ in FIG. 8. Also, the IR illumination lamps such as the LEDs 502 shown in FIG. 5 can be activated during the period $\Delta t$ so that as the camera is actively imaging the eye, the eye is being actively illuminated by IR radiation.

However, unlike the case of FIG. 6, the pupil tracking camera (and if desired IR illumination lamps) may remain energized after the start of the next active frame rendering period "P" up until "scan time t" within that next frame rendering period is reached, understanding that during this time, the nominal gaze of the pupil is not yet directed at an active frame rendering. Once "scan time t" is reached, the pupil camera can be deactivated (along with, if desired, the IR illumination lamps) until the start of the next null period $\Delta t$.

Figure 9:
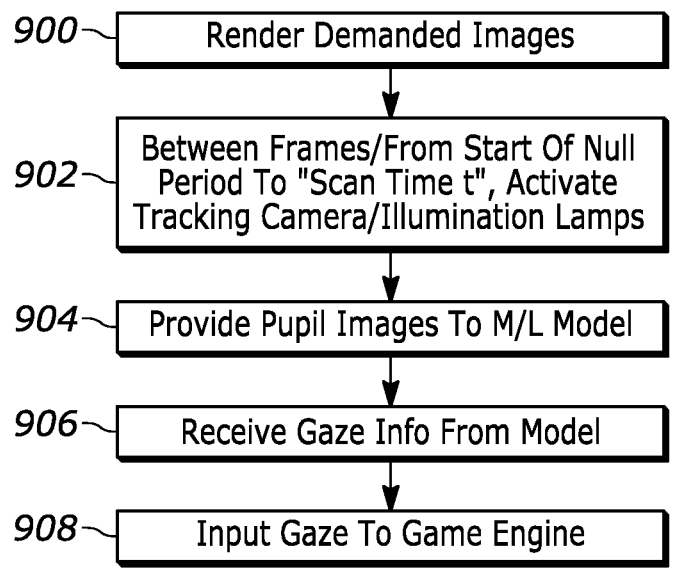
FIG. 9 illustrates example logic in example flow chart format consistent with present principles.

FIG. 9 illustrates example logic consistent with disclosure herein that may be implemented by any one or more of the processors described herein. Commencing at block 900, demanded images from, e.g., a computer simulation such as a computer game are rendered on a display such as any of the HMDs described herein. Moving to block 902, either between frames as shown in FIG. 6 or from the start of the null period $\Delta t$ until the "scan time t" of the next active frame rendering as shown in FIGS. 7 and 8, the pupil tracking camera and if desired IR illumination lamps described herein are activated to generate IR images of the pupil(s) of the wearer. The images are input to one or more machine learning (ML) models at block 904 to derive gaze direction information from the images, which is output by the ML model at block 906 and input to the game engine or other source of demanded images to block 900 at block 908.

The ML model(s) used at block 904 may be trained on a ground truth set of pupil images and ground truth gaze direction annotations.

While the particular embodiments are herein shown and described in detail, it is to be understood that the subject matter which is encompassed by the present invention is limited only by the claims.

What is claimed is:

1. An assembly, comprising:
    at least one organic light emitting diode (OLED) display comprising at least one innermost surface and at least one substrate;
    a coating on the substrate, the coating being transparent to at least near infrared (NIR) radiation but opaque to visible light; and
    at least one camera configured to generate images from IR light, the camera disposed to receive light through the coating.

2. The assembly of claim 1, wherein the coating comprises Zinc Selenide.

3. The assembly of claim 1, wherein the coating comprises Zinc Sulfide.

4. The assembly of claim 1, wherein the OLED display comprises a micro-OLED display.

5. The assembly of claim 1, comprising:
    at least one IR illumination lamp configured to emit IR toward an eye of a wearer of the apparatus.

6. The assembly of claim 1, comprising at least one processor configured with instructions to:
    activate the camera or the lamp or both the camera and the lamp starting at a beginning of a null period between first and second periods of rendering respective first and second frames of a demanded image.

7. The assembly of claim 6, wherein the instructions are executable to:
    deenergize the camera or the lamp or both the camera and the lamp at the end of the null period.

8. The assembly of claim 6, wherein the instructions are executable to:
    deenergize the camera or the lamp or both the camera and the lamp at a time during the second period of rendering the second frame of the demanded image.

9. The assembly of claim 1, wherein the camera is disposed on an outer surface of the substrate.

10. The assembly of claim 1, wherein the camera is connected to an arm and oriented to image an outer surface of the substrate.

11. The assembly of claim 1, comprising:
    a cathode layer supported on the substrate.

12. The assembly of claim 1, comprising:
    an electron transport layer supported on the substrate.

13. The assembly of claim 1, comprising:
    a blocking layer supported on the substrate.

14. The assembly of claim 1, comprising:
    an emissive layer of OLED supported on the substrate.

15. The assembly of claim 1, comprising:
    a hole transport layer supported on the substrate.

16. The assembly of claim 1, comprising:
    a hole injection layer supported on the substrate.

* * * * *